United States Patent [19]

Tominaga et al.

[11] Patent Number: 5,089,071
[45] Date of Patent: Feb. 18, 1992

[54] PROCESS FOR PRODUCING A MULTILAYERED CERAMIC STRUCTURE USING AN ADHESIVE FILM

[75] Inventors: Takashi Tominaga; Takahumi Sakuramoto; Souji Nishiyama; Kiyohiro Kamei; Yoshiki Kobayashi; Gosei Uemura, all of Osaka, Japan

[73] Assignee: Nitto Electrical Industrial, Osaka, Japan

[21] Appl. No.: 522,396

[22] Filed: May 1, 1990

Related U.S. Application Data

[63] Continuation of Ser. No. 431,729, Nov. 3, 1989, abandoned, which is a continuation of Ser. No. 237,197, Aug. 29, 1988, abandoned.

[51] Int. Cl.⁵ .............................................. B32B 18/00
[52] U.S. Cl. .................................... 156/89; 156/306.6; 156/313
[58] Field of Search ...................... 156/89, 306.6, 313

[56] References Cited

U.S. PATENT DOCUMENTS

| | | | |
|---|---|---|---|
| 3,293,072 | 12/1966 | Doolittle et al. | 156/89 |
| 3,506,473 | 4/1970 | Ettre | 156/89 |
| 3,574,029 | 4/1971 | Ettre | 156/89 |
| 3,598,679 | 8/1971 | Ettre et al. | 156/89 |
| 3,728,185 | 4/1973 | Gray | 156/89 |

*Primary Examiner*—Caleb Weston
*Attorney, Agent, or Firm*—Sughrue, Mion, Zinn, Macpeak & Seas

[57] ABSTRACT

An adhesive film comprising a ceramic powder and an adhesive composition having pressure-sensitive properties at room temperature (20° C.), and a process for producing a multilayered ceramic structure, such as multilayered ceramic substrates, laminated ceramic capacitors, etc. using the adhesive film, are disclosed.

4 Claims, 2 Drawing Sheets

PROCESS FOR PRODUCING A MULTILAYERED CERAMIC STRUCTURE USING AN ADHESIVE FILM

This is a continuation of application Ser. No. 07/431,729, filed Nov. 3, 1989, now abandoned, a Continuation of Appl. Ser. No. 07/237,197, filed Aug. 29, 1988, now abandoned.

FIELD OF THE INVENTION

The present invention relates to an adhesive film useful in multilayered ceramic substrates, laminated ceramic capacitors, etc. and also a process for producing a multilayered ceramic structure using the adhesive film.

BACKGROUND OF THE INVENTION

Multilayered ceramic structures of this type contemplated by the present invention are generally produced by placing in superposition at least two molded sheets containing a ceramic powder and a binder (these sheets are usually referred to as "ceramic green sheets") to prepare a laminate and burning the laminate. The interface between the molded sheets is subjected to a suitable treatment, such as screen printing of an electroconductive powder paste, in accordance with the intended use of the multilayered ceramic structure to be finally obtained.

In this production process, in preparing a laminate by superposing the molded sheets, the molded sheets superposed on each other to form a unitary laminate have to be bonded together by appropriate means so as to prevent a positional deviation between the sheets during handling prior to the burning step (e.g., punching the laminate into a predetermined shape) or during the burning step. To attain this purpose, one of the following bonding methods has been commonly employed: An adhesive polymer is dissolved in an organic solvent and the so prepared adhesive solution is applied to the opposing surfaces of molded sheets by a suitable coating means such as brushing or rollers; or the molded sheets are bonded into a unitary laminate by applying a suitable degree of pressure at temperatures not lower than the softening point of a binder in the sheets.

However, the first method involves difficulty in forming a thin uniform coating and partial delamination or positional deviation is likely to occur between sheets when the laminate is punched into a certain shape. Unevenness in the thickness of coating causes an additional disadvantage in that the thicker portion of the adhesive coating will lead to the formation of voids or blisters between the sheets at burning and the interlaminar adhesiveness of the sheets will be greatly impaired to eventually cause significant deterioration in the quality and yield of the finally produced multilayered ceramic structure. As a further problem, the adhesive solution has to be applied manually and great care must be exercised during coating operations in order to minimize the occurrence of the troubles described above. As a result, it has been difficult to fully automate the manufacturing process including lamination, punching and burning if the individual sheets are bonded by application of an adhesive solution.

The second method which employs hot pressing requires very fine control of temperature and pressure; if either temperature or pressure is insufficient, poor adhesion will result, and if they are excessive, troubles will occur such as the deformation of molded sheets and discontinuity of the electrical path formed of a conductive powder paste.

SUMMARY OF THE INVENTION

Accordingly, one object of the present invention is to provide an adhesive film which ensures reliable bonding of molded sheets.

Another object of the present invention is to provide a process for producing a multilayered ceramic structure, which enables molded sheets to be laminated into a laminate without causing deformation of the individual sheets or discontinuity of the current path formed of a conductive powder paste and which also permits the laminate to be punched into a desired shape without causing delamination or positional deviation or to be burned without causing voids or blisters between sheets.

In accordance with the process of the present invention, multilayered ceramic structures of high quality can be produced in high yield and the ceramic structures obtained have an excellent interlaminar bonding and are free not only from deformation of individual layers but also from the discontinuity of a conductor path. As a further advantage, the process of the present invention is highly adapted for automation in commercial operations.

The present inventors conducted intensive studies in order to attain the above-described objects, and found that all of the problems associated with the prior art could be overcome by laminating molded sheets in a unitary laminate using a preliminarily formed adhesive film having a uniform thickness containing a ceramic powder and having pressure-sensitive adhesive properties at room temperature. The present invention has been accomplished on the basis of this finding.

Therefore, in one embodiment, the present invention relates to an adhesive film comprising a ceramic powder and an adhesive composition which has pressure-sensitive adhesive properties at room temperature (25° C., hereinafter the same).

In another embodiment, the present invention relates to a process for producing a multilayered ceramic structure, which comprises: preparing a laminate comprising at least two molded sheets containing a ceramic powder and a binder (which are hereinafter referred to as "ceramic green sheets") and an adhesive film interposed between these ceramic green sheets, which contains a ceramic powder and an adhesive composition having pressure-sensitive adhesive properties at room temperature; and burning the prepared laminate to form a multilayered ceramic structure.

DETAILED DESCRIPTION OF THE INVENTION

The adhesive film according to the first embodiment of the present invention and the process for producing a multilayered ceramic structure according to the second embodiment of the present invention are described hereinafter in detail by reference to the accompanying drawings.

The "ceramic green sheet" for use in the process of the present invention is formed from a ceramic composition having a ceramic powder and a binder which are dispersed in an organic solvent, and this composition is molded in a sheet form with a dry thickness of normally about 0.3 to 2.0 mm by a suitable method such as screen printing or doctor blading.

The ceramic powder used in the present invention is particles of conventional ceramic material such as alumina, beryllia, steatite, barium titanate and magnesium titanate powders, and the particles have an average particle size of about 0.1 to 10 $\mu$m.

The binder used in the present invention is selected from various resins and rubber-base polymers including ethyl cellulose, nitrocellulose and polyalkyl (meth) acrylate ester resins. The binder is preferably used in such an amount that its content in the total weight of the binder and the ceramic powder is in the range of from about 4 to about 30 wt%. If the content of the binder is excessive, satisfactory results are not easily obtainable in terms of the density and other qualities of the burned ceramic product.

Any organic solvent can be used if it is capable of dissolving the binder, and specific examples thereof are xylene, toluene and butanol.

Besides the components described above, optional ingredients such as talc, kaolin, CaO, MgO (magnesia) and $SiO_2$ (silica) may be incorporated in the ceramic composition so that they will be eventually present in the ceramic green sheet. The use of these optional ingredients is preferably 15 wt% or less based on the total weight of the ceramic green sheet.

Figure 1A:
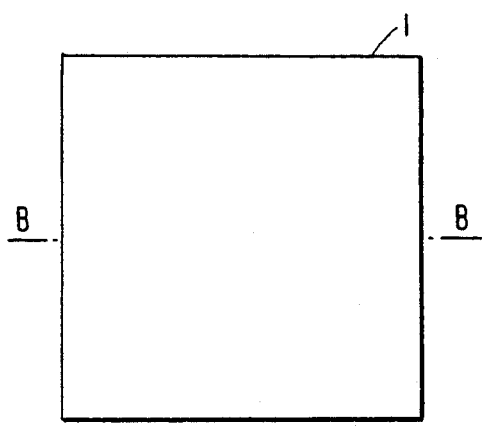
FIGS. 1A and 2A are plan views showing different examples of a molded sheet containing a ceramic powder and a binder.
Figure 2A:
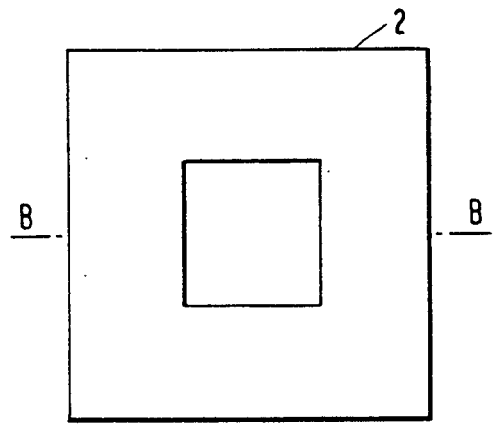
Figure 1B:
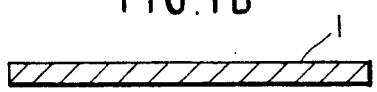
FIGS. 1B and 2B are cross sections of FIGS. 1A and 2A, respectively, which are taken on line B—B.
Figure 2B:
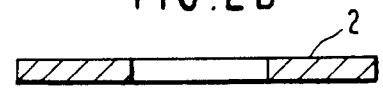
Figure 3:
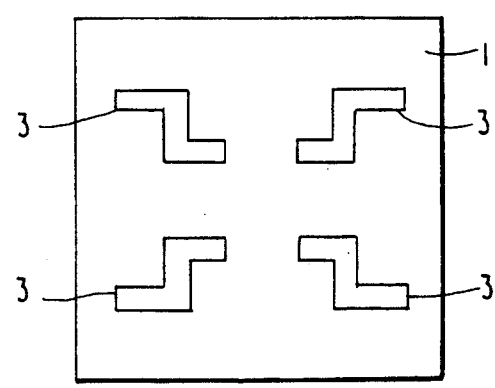
FIG. 3 is a plan view of the molded sheet shown in FIGS. 1A and 1B which have a layer of electroconductive powder paste printed of its surface.

The ceramic green sheet having the composition described above is punched to form a sheet having the shape and size shown in FIGS. 1A and 1B or FIGS. 2A and 2B to prepare a sheet for preparation of a laminate. Further, the surface of a ceramic green sheet on which another green sheet is to be superposed is usually provided with a patterned layer of conductive powder paste by screen printing as shown in FIG. 3. In FIGS. 1 to 3, the ceramic green sheets are indicated by 1 and 2, and the layer of conductive powder paste is indicated by 3. FIG. 3 shows the case where the layer 3 of conductive powder paste is formed on the ceramic green sheet 1 (FIGS. 1A and 1B) and the thickness of the paste layer normally ranges from about 5 to about 100 $\mu$m.

The conductive powder paste is prepared by kneading a binder and an organic solvent together with an electroconductive powder having an average particle size of about 0.5 to 10 $\mu$m such as molybdenum, tungsten, gold, silver, platinum, palladium or alloys thereof. The binder and organic solvent which are mixed with this powder may be selected from those which are described above as components of the ceramic composition. The binder is normally used in an amount of from about 1 to about 5 wt% based on the total weight of the binder and the conductive powder. The organic solvent is generally used in an amount of from about 5 to about 20 wt% based on the total weight of the paste.

Figure 4A:
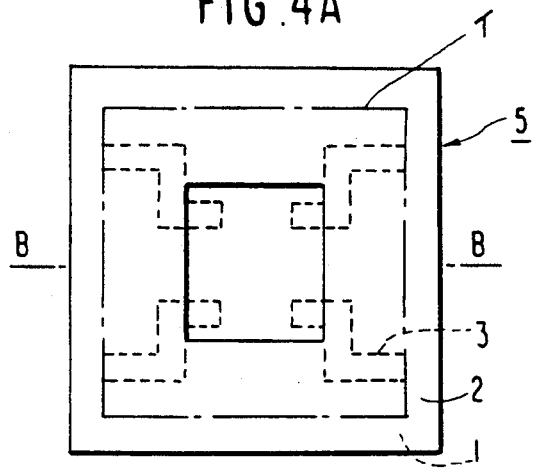
FIG. 4A is a plan view of a unitary laminate formed by bonding the molded sheet shown in FIGS. 2A and 2B on the molded sheet shown in FIG. 3 with an adhesive film which contains a ceramic powder being interposed between the two molded sheets.
Figure 4B:
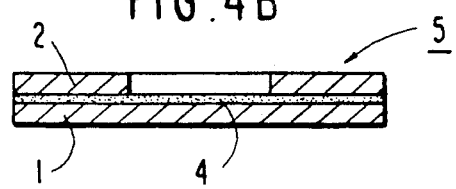
FIG. 4B is a cross section of FIG. 4A taken on line B—B.

According to the present invention, ceramic green sheets having the composition described above are bonded each other by interposing an adhesive film containing a ceramic powder and an adhesive composition having pressure-sensitive adhesive properties at room temperature therebetween to form a laminate. An example of the so formed unitary laminate is shown in FIGS. 4A and 4B, wherein the ceramic green sheet 1 (FIG. 1) having a layer 3 of the conductive powder paste formed thereon is bonded to the ceramic green sheet 2 (FIG. 2) through the above-described adhesive film 4 having pressure-sensitive adhesive properties at room temperature to form a laminate 5.

Figure 5:
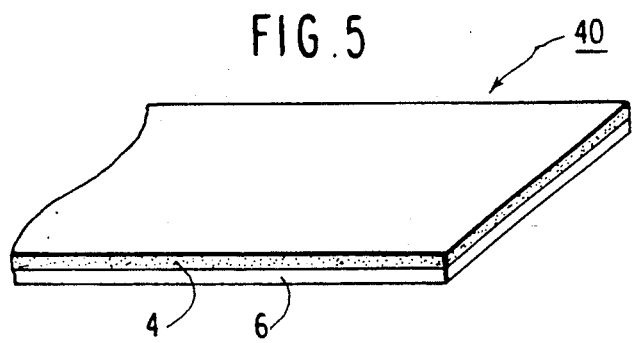
FIG. 5 is a perspective view of an adhesive composite of an adhesive film containing a ceramic powder and a release film disposed thereon.

In preparing the laminate 5, an adhesive composite 40 having a broad width may be employed and as shown in FIG. 5, this composite comprises an adhesive film 4 containing a ceramic powder and a release film 6 formed thereon. The release film 6 is a film prepared by applying a release agent such as a silicone resin onto a synthetic resin film having a high degree of surface smoothness such as a polyethylene terephthalate film. The adhesive film 4 is formed on this release film 6 by adding a ceramic powder to an adhesive composition having pressure-sensitive adhesive properties at room temperature comprising as a main component a polymer such as polyalkyl (meth) acrylate ester or rubber-base polymer and coating the resulting mixture on the release film by appropriate means such as roll coater method.

The ceramic powder to be contained in the adhesive composition preferably has the same composition as in the ceramic powder which is used to prepare the above-described ceramic green sheet, and is selected from particles of conventional ceramic material, such as alumina, beryllia, steatite, barium titanate and magnesium titanate powders. The particles have an average particle size of about 0.1 to 10 $\mu$m.

The content of the ceramic powder is preferably adjusted within the range of 20 to 80 wt% based on the total weight of the adhesive film 4. If the content of the ceramic powder is less than 20 wt% based on the total weight of the adhesive film, the intended effect of incorporating the ceramic powder (i.e., improving the interlaminar bonding strength of the multilayered ceramic structure) cannot be fully attained. If the content of the ceramic powder exceeds 80 wt% based on the total weight of the adhesive film, the adhesive composition will have only poor film-forming properties.

Besides the components described above, the adhesive composition may contain optional ingredients such as inorganic powders, e.g., particles of talc, kaolin, CaO, MgO and $SiO_2$. Optional ingredients selected from these inorganic powders are used in such amounts that the total weight of optional ingredient(s) and the ceramic powder is within the range of from 20 to 80 wt% based on the total weight of the adhesive film 4.

The adhesive composite 40 is molded to the same size as the ceramic green sheets 1 and 2 by punching. The punched composite is adhered to the ceramic green sheet 1 while peeling the release film 6 from the composite. Thereafter, the other ceramic green sheet 2 is superposed on the adhesive film 4 and the two green sheets are compressed as required to prepare a laminate 5.

The thickness of the adhesive film 4 in the composite 40 is generally 30 μm or less, preferably from about 5 to about 20 μm. If the adhesive film 4 is too thin, delamination or positional deviation tends to occur between the sheets 1 and 2 when the laminate 5 is punched. If the adhesive film 4 is too thick, voids or blisters tend to occur between the sheets during burning and the final product will have only poor interlaminar bonding.

Figure 6:
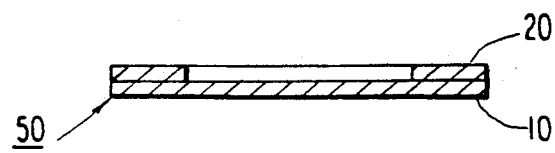
FIG. 6 is a cross section of a multilayered ceramic structure produced by burning a punched element of the laminate shown in FIGS. 4A and 4B.

The laminate 5 thus prepared is punched into a desired shape having the size denoted by one-long-and-one-short dashed line (a) in FIG. 4A. The punched laminate is then burned at high temperature. In the burning step, the binder in the ceramic green sheets 1 and 2 and in the conductive powder paste layer 3, and the polymer component in the adhesive film 4 are carbonized and disappeared, and the sheets 1 and 2 are essentially converted to ceramic bodies 10 and 20 as shown in FIG. 6. The ceramic powder in the adhesive film 4 are integrally bonded to both sheets 1 and 2 upon burning, thereby producing a multilayered ceramic structure 50 comprising the ceramic bodies 10 and 20 and having an excellent interlaminar bonding and a high degree of adhesive strength.

The heating temperature in the burning step is not generally determined because it depends on such factors as the type of ceramic powder in the ceramic green sheet and the adhesive film, as well as the type of conductive powder in the layer of conductive powder paste. Usually, the heating temperature is selected from the range of 1,400 to 2,000° C. in accordance with the type of each of these powders. The burning atmosphere also depends upon the type of ceramic powder or conductive powder and is an oxidizing gas atmosphere (including air atmosphere) or a non-oxidizing gas atmosphere such as vacuum or hydrogen gas. If the ceramic powder and the conductive powder are an alumina powder and a platinum powder, respectively, an oxidizing gas atmosphere can be employed as the burning atmosphere. If the conductive powder is a molybdenum powder, a non-oxidizing gas atmosphere can be employed.

The foregoing description is based on the embodiment where two ceramic green sheets are laminated to form a laminate. However, it should be noted that more than two sheets can be laminated. If the number of sheets to be laminated is up to 10, the above-described adhesive film containing a ceramic powder can be placed between sheets and the resulting laminate can be processed by the same method as described above. As a result, a multilayered ceramic structure having high quality can be obtained, which has an excellent interlaminar bonding and is free not only from deformation of individual layers but also from discontinuity of conductor paths. In the foregoing description, the adhesive film containing a ceramic powder is provided over the entire portion of the interface between adjacent sheets, but if necessary, such an adhesive film may be disposed only in selected areas of the interface between adjacent sheets.

To summarize the advantages of the present invention, it first provides an adhesive film comprising a ceramic powder and an adhesive composition having pressure-sensitive adhesive properties at room temperature. Since this film has a small and uniform thickness and offers pressure-sensitive adhesive properties at room temperature, the film can be employed in bonding ceramic green sheets before they are burned and this embodiment is very effective for the purpose of fully automating the manufacturing process of a multilayered ceramic structure including lamination of ceramic green sheets, punching of the laminate and burning of the punched laminate.

Further, the use of this adhesive film can eliminate various problems such as delamination and positional deviation that occur in the punching operation, as well as the occurrence of voids and blisters between sheets during burning, which previously caused poor adhesion resulting from unevenness in the application of an adhesive solution or variations in the coating thickness. The present invention also eliminates the problems associated with the conventional hot press method which involves poor adhesion between sheets, as well as deformation of sheets and discontinuity of the current path formed of the conductive powder paste. As a further advantage, the ceramic powder in the adhesive film will provide a strong bonding of the sheets upon burning, thereby providing improved interlaminar bonding strength of the final product. Therefore, the process of the present invention can produce a high quality multilayered ceramic structure having an excellent interlaminar bonding strength and being free from the deformation of individual layers or discontinuity of conductor paths in a high yield.

The present invention is now explained in greater detail by reference to the following examples, but it should be understood that they are not intended to limit the present invention.

EXAMPLE 1

A ceramic composition comprising 93 g of an alumina powder (average particle size: 2 μm), 7 g of talc, 10 g of polymethyl methacrylate and 100 g of xylene was mixed in a ball mill. The mixture was molded by doctor blading to form a sheet having a dry thickness of 1 mm, following by drying. The ceramic green sheet thus prepared was punched to form two sheets; one of them was a ceramic green sheet 1 having the shape shown in FIGS. 1A and 1B which measured 70 mm long and 70 mm wide, and the other was a ceramic green sheet 2 having the shape shown in FIGS. 2A and 2B which had outside dimensions of 70 mm × 70 mm and inside dimensions of 25 mm × 25 mm.

A composition comprising 100 g of a platinum powder (average particle size: 5 μm), 2 g of nitrocellulose and 10 g of xylene was mixed in a ball mill to form a conductive powder paste. One side of the ceramic green sheet 1 or 2 was patterned with the conductive powder paste by screen printing as shown in FIG. 3 to form a layer 3 of conductive powder paste in a thickness of 30 μm. A 10 μm thick adhesive film 4 containing a ceramic powder and having pressure-sensitive adhesive properties at room temperature was adhered to the side of the ceramic green sheet 1 where the layer 3 of conductive powder paste had been formed. The other ceramic green sheet 2 was superposed on the adhesive film 4 in such a manner that their outside dimensions would be in agreement. The two ceramic green sheets 1 and 2 were compressed to prepare a laminate 2 as shown in FIGS. 4A and 4B. The laminate had an excellent bonding between the sheets 1 and 2 but did not have any deformation of the sheets or discontinuity of the conductor path formed of paste layer 3.

The adhesive film 4 was adhered to the ceramic green sheet 1 by the following method. A polyethylene terephthalate film was treated with silicone resin to prepare a release film 6. A polyalkyl (meth) acrylate ester as a polymer component was blended with an alumina powder (average particle size: 2.5 μm) and talc in respective amounts of 45 g and 5 g per 100 g of the polymer component to prepare an adhesive composition having pressure-sensitive adhesive properties at room temperature. This adhesive composition was coated in a dry thickness of 10 μm on the release film 6 and dried to form a broad adhesive composite 40 having an adhesive film 4 containing a ceramic powder formed on the release film 6 as shown in FIG. 5. This composite 40 was punched to the same size as that of the ceramic green sheets 1 and 2 and adhered to the ceramic green sheet 1 while peeling the release film 6.

The thus prepared laminate 5 was punched to the size of 50 mm×50 mm as indicated by one-long-and-one-short dashed line (a) in FIG. 4A. No delamination or positional deviation occurred between the ceramic green sheets 1 and 2 when the laminate was molded by punching. The punched laminate was then burned in air at 1,600° C. for 30 minutes to prepare a multilayered ceramic structure 50 having the layer arrangement shown in FIG. 6. The adhesion between the ceramic bodies 10 and 20 in the ceramic structure 50 was very good and their bonding strength was also very high. No blister or void occurred between the ceramic bodies, nor did they suffer any deformation such as warpage. There also was no sign of discontinuity of the conductor path.

EXAMPLE 2

A multilayered ceramic structure was produced by repeating the procedures of Example 1 except for the following points: the adhesive composition having pressure-sensitive adhesive properties at room temperature used to prepare the adhesive film 4 was prepared from a mixture of isoprene-based rubber (100 g), a petroleum-based resin (40 g), an alumina powder (40 g; average particle size: 1.5 μm), a magnesia powder (5 g; average particle size: 1.0 μm) and a silica powder (5 g; average particle size; 1.0 μm); this composition was coated in a dry thickness of 5 μm on a release film 6 and dried to form an adhesive composition 40; the laminate of ceramic green sheets 1 and 2 was then burned in a hydrogen gas atmosphere at 1,650° C. for 40 minutes.

The results were entirely the same as those obtained in Example 1. The laminate was successfully fabricate without causing any problems including poor adhesion, sheet deformation and discontinuity of the current path formed of the conductive powder paste; there hardly occurred any delamination or positional deviation between sheets when the laminate was punched; and the occurrence of voids, blisters or warpage was barely detectable in the burning step. Therefore, the multilayered ceramic structure produced in Example 2 had high quality in that it had an excellent interlaminar adhesiveness and high bonding strength, because of suffering no disadvantage such as deformation of layers or discontinuity of conductor paths.

EXAMPLE 3

A multilayered ceramic structure was produced by repeating the procedures of Example 1 except for the following points: The adhesive composition having pressure-sensitive adhesive properties at room temperature used to prepare the adhesive film 4 was prepared from a mixture of isoprene-based rubber (70 g), a petroleum-based resin (30 g), an alumina powder (95 g; average particle size: 1.5 μm), a talc powder (2.5 g; average particle size: 1.0 μm) and a kaolin powder (2.5 g; average particle size: 1.0 μm); and this composition was coated in a dry thickness of 10 μm on a release film 6 and dried to form an adhesive composite 40.

The results were the same as those obtained in Example 1. The laminate could be handled satisfactorily without causing any problems including poor adhesion, sheet deformation and discontinuity of conductor paths, and the finally obtained multilayered ceramic structure had high quality in that it exhibited an excellent interlaminar adhesiveness and high bonding strength.

EXAMPLE 4

A ceramic composition comprising 96 g of an alumina powder (average particle size: 2.5 μm), 3 g of silica, 1 g of magnesia, 10 g of polymethyl methacrylate and 100 g of toluene was mixed in a ball mill. The mixture was molded by doctor blading to form a sheet having a dry thickness of 0.8 μm, followed by drying. The thus prepared sheet was punched to form two identically molded ceramic green sheets (70 mm×70 mm).

In a separate step, a polyethylene terephthalate film as a polymer component was treated with silicone resin to prepare a release film 1. A polyalkyl (meth) acrylate ester was blended with an alumina powder (average particle size: 2.0 μm), silica and magnesia in respective amounts of 285 g, 12 g and 3 g per 100 g of the polymer component to prepare an adhesive composition having pressure-sensitive adhesive properties at room temperature. This adhesive composition was coated in a dry thickness of 15 μm on the release films and dried to form an adhesive film containing an alumina powder.

The thus prepared adhesive film on the release film was cut to a size of 70 mm×70 mm and placed between the two previously prepared ceramic green sheets while peeling the release film. The green sheets were then compressed to form a laminate. Due to the presence of the adhesive film, the resulting laminate had very strong adhesive strength between the green sheets.

The laminate was then burned in air at 1,600° C. for 30 minutes to prepare a multilayered ceramic structure. This structure had a very good interlaminar adhesiveness and a very strong bonding strength between the ceramic layers. No blisters or voids occurred between the ceramic layers, nor did they suffer any deformation such as warpage.

While the invention has been described in detail and with reference to specific embodiments thereof, it will be apparent to one skilled in the art that various changes and modifications can be made therein without departing from the spirit and scope thereof.

What is claimed is:

1. A process for producing a multilayer ceramic laminate structure comprising the steps of:
   (1) forming at least two ceramic green molded sheets containing ceramic powder and a binder which are dispersed in an organic solvent, and wherein said green molded sheets have a thickness of about 0.3 mm to 2.0 mm;
   (2) applying a preformed pressure sensitive adhesive film consisting essentially of the same ceramic powder as said ceramic green molded sheets and an adhesive composition having pressure sensitive properties at room temperature to said first ceramic green molded sheet and pattern, and wherein the ceramic powder in said adhesive film is from 20 to 80 wt% and said adhesive film has a thickness of about 30 μm or less;

(3) laminating a second ceramic green molded sheet with said first ceramic green molded sheet, and wherein said adhesive film is interposed therebetween; and (4) burning the formed laminate to produce said multilayered ceramic structure.

2. The process as claimed in claim 1, wherein the content of said ceramic powder in said adhesive film is from 20 to 80 wt%.

3. The process as claimed in claim 1, wherein an interface between said molded sheets constituting the laminate has a layer of an electroconductive powder paste patterned by printing.

4. A process as claimed in claim 1, wherein the laminate is punched to a predetermined shape before the burning step.

* * * * *